(12) United States Patent
Van De Rijdt et al.

(10) Patent No.: US 7,405,807 B2
(45) Date of Patent: Jul. 29, 2008

(54) METHOD OF FORMING OPTICAL IMAGES, APPARATUS FOR CARRYING OUT SAID METHOD AND PROCESS FOR MANUFACTURING A DEVICE USING SAID METHOD

(75) Inventors: Johannes Hubertus Antonius Van De Rijdt, Eindhoven (NL); Roger Timmermans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 339 days.

(21) Appl. No.: 10/569,186

(22) PCT Filed: Aug. 10, 2004

(86) PCT No.: PCT/IB2004/051434

§ 371 (c)(1),
(2), (4) Date: Feb. 22, 2006

(87) PCT Pub. No.: WO2005/022265

PCT Pub. Date: Mar. 10, 2005

(65) Prior Publication Data

US 2006/0256310 A1    Nov. 16, 2006

(30) Foreign Application Priority Data

Aug. 27, 2003   (EP)   ................... 03103225

(51) Int. Cl.
*G03B 27/54* (2006.01)
*G03B 27/42* (2006.01)
*G03B 27/32* (2006.01)
*G03C 5/00* (2006.01)
*G02B 27/10* (2006.01)

(52) U.S. Cl. .............................. 355/67; 355/53; 355/77; 430/30; 359/619

(58) Field of Classification Search ................... 355/53, 355/67, 77; 430/30, 311, 396; 359/619
See application file for complete search history.

(56) References Cited

U.S. PATENT DOCUMENTS 6,133,986 A    10/2000   Johnson (Continued)

FOREIGN PATENT DOCUMENTS

WO    03040830 A2    5/2003

(Continued)

OTHER PUBLICATIONS

Dario Gil, et al: Lithographic Patterning and Confocal and Henry I. Smith, Aug. 2000, pp. 2881-2885.

(Continued)

*Primary Examiner*—Alan A Mathews

(57) ABSTRACT

An optical image is formed in a resist layer (5) by a number of subilluminations, in each of which an array of light valves (21 25) and a corresponding array (40) of light converging elements are used to form a pattern of spots in the resist layer according to a sub image Between the sub illuminations, the resist layer (5) is displaced relative to the arrays (21 25, 40) The scale of the optical image in the resist layer (5) is measured and this scale is compared with the scale of the image required to be written If there is a difference, the spacing between the light converging elements (43) is physically altered to adjust the substrate scale.

14 Claims, 3 Drawing Sheets

U.S. PATENT DOCUMENTS

| | | |
|---|---|---|
| 6,288,830 B1 | 9/2001 | Kinoshita |
| 6,424,404 B1 * | 7/2002 | Johnson .................... 355/44 |
| 6,537,738 B1 | 3/2003 | Mei et al. |
| 6,897,941 B2 * | 5/2005 | Almogy .................... 355/67 |
| 7,154,674 B2 * | 12/2006 | Nellissen ................. 359/619 |
| 2005/0078294 A1 * | 4/2005 | Nellissen .................. 355/77 |

FOREIGN PATENT DOCUMENTS

WO     03052515 A1    6/2003

OTHER PUBLICATIONS

Written Opinion of the International Searching Authority PCT/IB2004/051434, (Aug. 24, 2005).

* cited by examiner

METHOD OF FORMING OPTICAL IMAGES, APPARATUS FOR CARRYING OUT SAID METHOD AND PROCESS FOR MANUFACTURING A DEVICE USING SAID METHOD

This application is a U.S. National Stage Application filed under 35 U.S.C. 371 claiming priority from the International Application No. PCT/IB2004/051434 filed Aug. 10, 2004, which application claims the benefit of the European Application 03103225.3, filed Aug. 27, 2003.

The invention relates to a method of forming an optical image in a radiation-sensitive layer, the method comprising the steps of:

providing a radiation source;

providing a radiation-sensitive layer;

positioning a plurality of individually controlled light valves between the radiation source and the radiation-sensitive layer;

positioning a plurality of radiation-converging elements between the plurality of light valves and the radiation-sensitive layer, such that each converging element corresponds to a different one of the light valves and serves to converge radiation from the corresponding light valve in a spot area in the radiation-sensitive layer;

simultaneously writing image portions in radiation-sensitive layer areas by scanning said layer, on the one hand, and the associated light valves/converging element pairs, on the other hand, relative to each other and switching each light valve between an on and an off state in dependence upon the image portion to be written by the light valve.

The invention also relates to an apparatus for carrying out this method and to a method of manufacturing a device using this method.

The plurality of light valves, or optical shutters, is preferably arranged in an array.

An array of light valves, or optical shutters, is understood to mean an array of controllable elements, which can be switched between two states. In one of the states radiation incident on such an element is blocked and in the other state the incident radiation is transmitted or reflected to follow a path that is prescribed in the apparatus of which the array forms part.

Such an array may be a transmissive or reflective liquid crystal display (LCD) or a digital mirror device (DMD). The radiation-sensitive layer is, for example, a resist layer used in optical lithography, or an electrostatic charged layer used in a printing apparatus.

This method and apparatus may be used, inter alia, in the manufacture of devices such as liquid crystal display (LCD) panels, customized-Ics (integrated circuits) and PCBs (printed circuit board). Currently, proximity printing is used in the manufacture of such devices. Proximity printing is a fact and cheap method of forming an image in a radiation-sensitive layer on a substrate of the device, which image comprises features corresponding to device features to be configured in a layer of the substrate. Use is made of a large photomask that is arranged at a short distance, called the proximity gap, from the substrate, and the substrate is illuminated via the photomask by, for example, ultraviolet (UV) radiation. An important advantage of the method is the large image field, so that large device patterns can be imaged in one image step. The pattern of a conventional photomask for proximity printing is a true, one-to-one copy, of the image required on the substrate, i.e. each picture element (pixel) of this image is identical to the corresponding pixel in the mask pattern.

Proximity printing has a limited resolution, i.e. the ability to reproduce the points, lines etc., in general the features, of the mask pattern as separate entities in the sensitive layer on the substrate. This is due to the diffractive effects, which occur when the dimensions of the features decrease with respect to the wavelength of the radiation used for imaging. For example, for a wavelength in the near UV range and a proximity gap width of 100 µm, which means that pattern features at a mutual distance of 10 µm can be imaged as separate elements.

To increase the resolution in optical lithography, a real projection apparatus is used, i.e. an apparatus having a real projection system like a lens projection system or a mirror projection system. Examples of such apparatus are wafer steppers or wafer step-and scanners. In a wafer stepper, a whole mask pattern, for example, an IC pattern is imaged in one go by a projection lens system on a first IC area of the substrate. Then the mask and substrate are moved (stepped) relative to each other until a second IC area is positioned below the projection lens. The mask pattern is then imaged on the second IC area. These steps are repeated until all IC areas of the substrate are provided with an image of the mask pattern. This is a time-consuming process, due to the sub-steps of moving, aligning and illumination. In a step-and-scanner, only a small portion of the mask pattern is illuminated at once. During illumination, the mask and the substrate are synchronously moved with respect to the illumination beam until the whole mask pattern has been illuminated and a complete image of this pattern has been formed on an IC area of the substrate. Then the mask and substrate are moved relative to each other until the next IC area is positioned under the projection lens and the mask pattern is again scan-illuminated, so that a complete image of the mask pattern is formed on the next IC area. These steps are repeated until all IC areas of the substrate are provided with a complete image of the mask pattern. The step-and-scanning process is even more time-consuming than the stepping process.

If a 1:1 stepper, i.e. a stepper with a magnification of one, is used to print a LCD pattern, a resolution of 3 µm can be obtained, however, at the expense of much time for imaging. Moreover, if the pattern is large and has to be divided into sub-patterns, which are imaged separately, stitching problems may occur, which means that neighbouring sub-fields do not fit exactly together.

The manufacture of a photomask is a time-consuming and cumbersome process, which renders such a mask expensive. If much re-design of a photomask is necessary or in case customer-specific devices, i.e. a relatively small number of the same device, have to be manufactured, the lithographic manufacturing method using a photomask is an expensive method.

The paper: "Lithographic patterning and confocal imaging with zone plates" of D. Gil et al in: J. Vac. Sci. Technology B 18(6), November/December 2000, pages 2881-2885, describes a lithographic method wherein, instead of a photomask, a combination of a DMD array and an array of zone plates is used. If the array of zone plates, also called Fresnel lenses, is illuminated, it produces an array of radiation spots, in the experiment described in the paper: an array of 3×3 X-ray spots, on a substrate. The spot size is approximately equal to the minimum feature size, i.e. the outer zone plate. The radiation to each zone plate is separately turned on and off by the micromechanic means of the DMD device, and arbitrary patterns can be written by raster scanning the substrate through a zone plate unit cell. In this way, the advantages of maskless lithography are combined with a high throughput due to parallel writing with an array of spots.

In general, in a flexible lithography system (i.e. lithography with changeable image pattern), the image magnification should be unity, i.e. whereby the feature sizes of the image pattern (image scale) are equal to the corresponding features at the substrate (substrate scale). However, in some cases, the size of the substrate may change slightly due to temperature variations or other causes known to a person skilled in the art, which changes the substrate scale such that it is no longer the same as the image scale. It is desirable to compensate for this change of substrate scale by adjusting the image scale and software-based systems for achieving this compensation have been proposed. One such system is a programmable system in the sense that each spot can be independently adjusted. However, a significant disadvantage of this solution is that when the substrate scale has been measured and the scale factor to be used (i.e. the required adjustment to compensate for the difference between the substrate scale and the image scale) has been determined, it is still necessary to determine billions of new spot positions. This is very time-consuming.

We have now devised an improved arrangement, which provides an accurate and radiation-efficient lithographic imaging method, which may employ different kinds of radiation sources.

In accordance with the present invention, there is provided a method of forming an optical image in a radiation-sensitive layer, the method comprising the steps of:
  providing a radiation source;
  providing a radiation-sensitive layer;
  positioning a plurality of individually controlled light valves between the radiation source and the radiation-sensitive layer;
  positioning an optical element comprising a plurality of radiation-converging elements between said light valves and the radiation-sensitive layer, such that each converging element corresponds to a different one of the light valves and serves to converge radiation from the corresponding light valve in a spot area in the radiation-sensitive layer;
  simultaneously writing image portions in radiation-sensitive layer areas by scanning said layer, on the one hand, and the associated light valve/converging element pairs, on the other hand, relative to each other and switching each light valve between an on and an off state in dependence upon the image portion to be written by the light valve; the method being characterized by the steps of
  measuring said written image portions and comparing a scale thereof to a corresponding image scale of the image portions required to be written by the light valves to determine whether or not there is a difference therebetween; and if so,
  adjusting said image scale so as to correspond with said measured scale;
  wherein said adjusting step comprises physically altering a distance between one or more adjacent radiation-converging elements relative to each other.

As a result, the image scale can be adjusted with little or no time cost within the operation cycle.

In one embodiment, the step of physically altering a distance between one or more adjacent radiation-converging elements relative to each other comprises applying a force, either compressive or expansive, to said optical element so as to respectively push the plurality of radiation-converging elements towards each other or pull them apart.

In an alternative embodiment, the step of physically altering a distance between one or more adjacent radiation-converging elements relative to each other comprises selectively increasing or decreasing the temperature of the optical element so as to respectively expand the optical element and increase the distance between the radiation-converging elements, or compress the optical element and decrease the distance between the radiation-converging elements.

The converging elements, which may be in the form of refractive lenses, are beneficially arranged to form a matrix array of spots. Refractive lenses may be preferred, because they tend to be considerably less sensitive to wavelength variations, so that chromatic aberrations can be avoided. These lenses tend to have a sharper focus than diffraction elements, because they show no order splitting.

A matrix array of spots is understood to mean a two-dimensional array having a comparable, albeit not necessarily the same, number of spots in two, mutually perpendicular directions. The matrix pitch may be of the order of a hundred times the spot size.

It is remarked that U.S. Pat. No. 6,288,830 discloses an optical image-forming method and device wherein a digital mirror device and an array of microlenses are used. According to the known method, the image is written line-by-line, and in order to obtain a high pixel density, each image line is written by means of a number n, for example six, mirror rows. The mirrors of each row are shifted over a distance p/n with respect to the light valves of the other lines, wherein p is the pitch of the mirrors in one row. In the known method, a single image pixel is written by means of corresponding pixels of all of the n rows, which row pixels are shifted relative to each other in the row direction. In the method of the present invention, each light valve is used to successively write a large number of pixels, i.e. all pixels of, for example a radiation-sensitive layer area having dimensions corresponding to the matrix pitch.

The method of the present invention may be further characterized in that, between successive sub-illuminations, the radiation-sensitive layer and the arrays are displaced relative to each other over a distance which is at most equal to the size of the spots formed in the radiation-sensitive layer.

In this way, image, i.e. pattern, features can be written with a constant intensity across the whole feature. The spots may have a circular, square, diamond or rectangular shape, dependent on the design of a beam-shaping aperture present in the apparatus. The size of the spot is understood to mean the size of the largest dimension within this spot.

If features of the image to be written are very close to each other, these features may broaden and blend with each other, which phenomenon is known as the proximity effect. An embodiment of the method, which prevents proximity effects from occurring, is characterized in that the intensity of a spot at the border of an image feature is adapted to the distance between this feature border and a neighbouring feature.

The method can be used in several applications. A first application is in the field of optical lithography. An embodiment of the method, which is suitable to form part of a lithographic process for producing a device in a substrate, is characterized in that the radiation-sensitive layer is a resist layer provided on the substrate, and in that image pattern corresponds to the pattern of features of the device to be produced.

This embodiment of the method may be further characterized in that the image is divided into sub-images each belonging to a different level of the device to be produced, and in that, during formation of the different sub-images, the resist layer surface is set at different distances from the array of refractive lenses.

This embodiment of the method allows imaging on different planes of the substrate and thus production of multiple level devices.

A second application is in the field of printing. An embodiment of the method, which is suitable to form part of a process for printing a sheet of paper, is characterized in that the radiation-sensitive layer is a layer of electrostatically charged material.

The method may be further characterized in that the array of light valves is positioned to directly face the converging elements.

The light valves and corresponding converging elements are positioned close to each other, without imaging means being arranged between them, so that the method can be performed by compact means. If the light valves comprise LCD cells, which modulate the polarization of incident radiation, a polarization analyzer is arranged between the LCD and the array of diffraction cells.

Alternatively, the method may be characterized in that the light valves are imaged on the converging elements.

Imaging one set of elements on the other by a projection lens provides advantages with respect to stability, thermal effects, and crosstalk.

The invention also relates to an apparatus for carrying out the method described above. This apparatus comprises:
  a radiation source;
  positioning means for positioning a radiation-sensitive layer relative to the radiation source;
  a plurality of individually controllable light valves arranged between the source and the location for the radiation-sensitive layer; and
  an imaging element comprising a plurality of radiation-converging elements arranged between the light valves and the location of the radiation-sensitive layer, such that each converging element corresponds to a different one of the light valves and serves to converge radiation from the corresponding light valve in a spot area in the radiation-sensitive layer;
  means for simultaneously writing image portions in radiation-sensitive layer areas by scanning said layer, on the one hand, and the associated light valve/converging element pairs, on the other hand, relative to each other and switching each light valve between an on and an off state in dependence upon the image portion to be written by the light valve; the apparatus being characterized by:
  means for measuring said written image portions and comparing a scale thereof to a corresponding image scale of the image portions required to be written by the light valves to determine whether or not there is a difference therebetween and, if so, for adjusting said image scale so as to correspond with said measured scale by physically altering a distance between one or more adjacent radiation-converging elements relative to each other.

The invention also relates to a method of manufacturing a device in at least one process layer of a substrate, the method comprising the steps of:
  forming an image, comprising features corresponding to device features to be configured in the process layer, in a resist layer provided on the process layer; and
  removing material from, or adding material to, areas of the process layer which areas are delineated by the image formed in the resist layer.

This method is characterized in that the image is formed by means of the method as described above.

Devices, which can be manufactured by means of this method and apparatus, are liquid crystal display devices, customer-specific ICs, electronic modules, printed circuit boards and MOEMS (integrated Micro-Optical-Electrical-Mechanical System), etc. An example of such a device is an integrated optical telecommunication device comprising a diode laser and/or detector, a light guide, an optical switch and possibly a lens between the light guide and the diode laser, or the detector.

These and other aspects of the invention are apparent from and will be elucidated, by way of non-limitative example, with reference to the embodiments described hereinafter.

An embodiment of the present invention will now be described by way of example only with reference to the accompanying drawings, in which.

Figure 1:
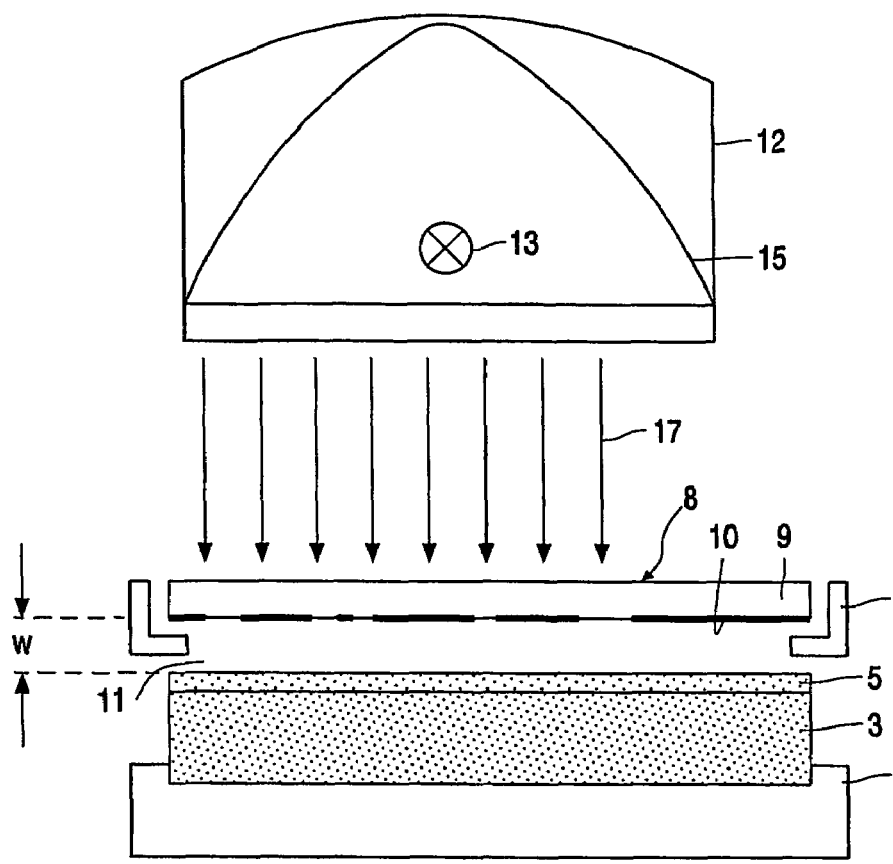
FIG. 1 illustrates schematically a conventional proximity printing apparatus.

FIG. 1 shows, very schematically, a conventional proximity printing apparatus for the manufacture of, for example an LCD device. This apparatus comprises a substrate holder 1 for carrying a substrate 3 on which the device is to be manufactured. The substrate is coated with a radiation-sensitive, or resist, layer 5 in which an image, having features corresponding to the device features, is to be formed. The image information is contained in a mask 8 arranged in a mask holder 7. The mask comprises a transparent substrate 9, the lower surface of which is provided with a pattern 10 of transparent and non-transparent strips and areas, which represent the image information. A small air gap 11 having a gap width w of the order of 100 μm separates the pattern 10 from the resist layer 5. The apparatus further comprises a radiation source 12. This source may comprise a lamp 13, for example, a mercury arc lamp, and a reflector 15. This reflector reflects lamp radiation, which is emitted in backward and sideways directions towards the mask. The reflector may be a parabolic reflector and the lamp may be positioned in a focal point of the reflector, so that the radiation beam 17 from the radiation source is substantially a collimated beam. Other or additional optical elements, like one or more lenses, may be arranged in the radiation source to ensure that the beam 17 is substantially collimated. This beam is rather broad and illuminates the whole mask pattern 10 which may have dimensions from 7.5×7.5 $cm^2$ to 40×40 $cm^2$. For example, illumination step has a duration of the order of 10 seconds. After the mask pattern has been imaged in the resist layer, this is processed in the well-known way, i.e. the layer is developed and etched, so that the optical image is transferred in a surface structure of the substrate layer being processed.

The apparatus of FIG. 1 has a relatively simple construction and is very suitable for imaging in one go a large area mask pattern in the resist layer. However, the photomask is an expensive component and the price of a device manufactured by means of such a mask can be kept reasonably low only if a large number of the same device is manufactured. Mask making is a specialized technology, which is in the hands of a relatively small number of mask manufacturing firms. The time a device manufacturer needs for developing and manufacturing a new device or for modifying an existing device is strongly dependent on delivery times set by the mask manufacturer. Especially in the development phase of a device, when redesigns of the mask are often needed, the mask is a capability-limiting element. This is also the case for low-volume, customer-specific devices.

Direct writing of a pattern in the resist layer, for example by an electron beam writer or a laser beam writer, could provide the required flexibility, but is not a real alternative because this process takes too much time.

Figure 2:
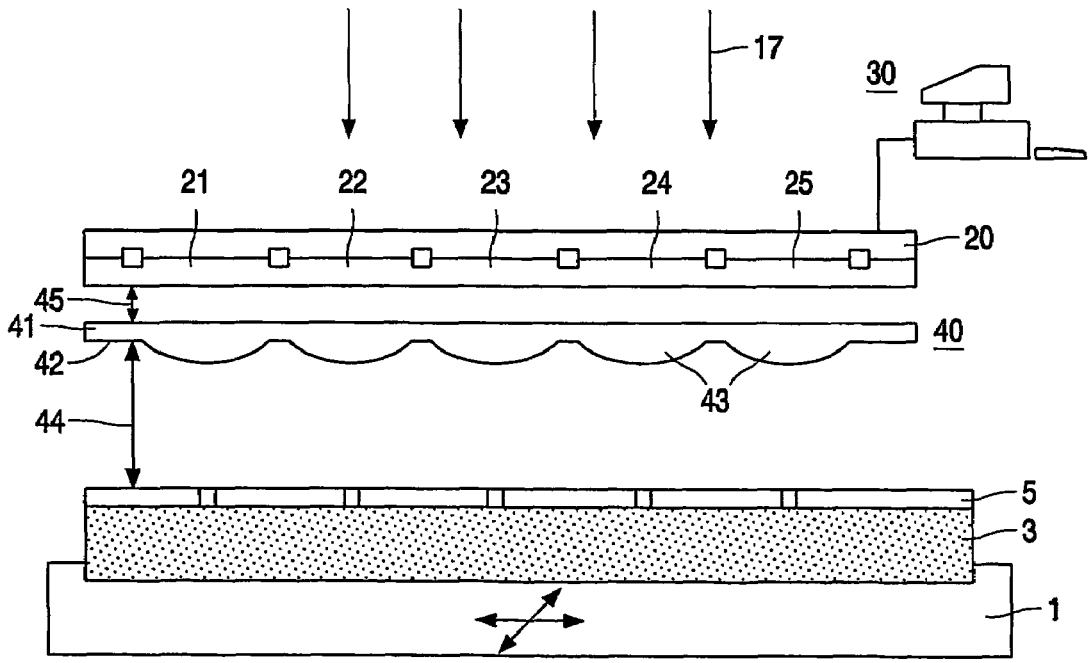
FIG. 2 is a schematic cross-sectional view of a maskless lithography system.

FIG. 2 shows the principle of a maskless method and apparatus by means of which an arbitrary and easily changeable image pattern can be formed in a resist layer within a reasonable time. FIG. 2 shows very schematically and in a vertical cross-section a small portion of the means which are used for performing the method and form part of the apparatus. The apparatus comprises a substrate holder 1 for accommodating a substrate, which is coated with a resist layer 5. Reference numeral 20 denotes a light valve device, for example a liquid crystal display (LCD), which is currently used in a display apparatus for displaying information, either in direct-view or in projection. Device 20 comprises a large number of light valves, also called pixels (picture elements) of which only a few are shown in FIG. 2 and denoted by reference numerals 21 to 25. The light valve device is controlled by a computer configuration 30 (not on scale) wherein the pattern, which is to be configured in a substrate layer, is introduced in software. The computer thus determines, at any moment of the writing process and for every light valve, whether it is closed, i.e. blocks the portion of the illuminating beam 17 incident on this light valve, or is open, i.e. transmits this portion to the resist layer. An imaging element 40 is arranged between the array of light valves 20 and the resist layer 5. This element comprises a transparent substrate 41 and an array 42 of radiation-converging elements 43. The number of these elements corresponds to the number of light valves, and the array 42 is aligned with the array of light valves so that each converging element belongs to a different one of the light valves.

As the radiation source, the substrate holder and the mask holder are less relevant for understanding the new method, these elements will not be described in detail.

According to the invention, the converging elements 43 are refractive lenses. Such lenses allow focusing of radiation from corresponding light valves in spots, which are smaller than those obtained with diffraction lenses. Moreover the optical performance of these lenses is substantially less dependent on the wavelength of the radiation than that of diffraction lens element.

Each spot occupies only a small, point-like portion of the resist layer area belonging to the light valve, which determines whether this spot is present or not. Hereinafter, the point-like resist areas will be called spot areas and the resist area belonging to a light valve will be called valve area. To obtain full features, i.e lines and areas, of the image pattern corresponding to the device features to be produced, the substrate with the resist layer, on the one hand, and the two arrays, on the other hand, should be displaced relative to each other. In other words, each spot should be moved in its corresponding valve area such that this area is fully scanned and illuminated at prescribed, i.e. feature-determined, positions. Most practically, this is realized by displacing the substrate step-wise in a gridlike pattern. The displacement steps are of the order of the size of the spots, for example of the order of 1 µm or smaller. A portion of the valve area belonging to a given spot, which portion is destined for an image feature or part thereof, is illuminated in flashes. For displacing the substrate holder in steps of 1 µm or smaller with the required accuracy, use can be made of servocontrolled substrate images, which are used in lithographic projection apparatus and operate with an accuracy of well below 1 µm, for example of the order of 10 nm.

The invention can be implemented with several types of radiation source, preferably lasers, especially lasers used currently or to be used in the near future in wafer steppers and wafer-step-and scanners, emitting radiation at wavelengths of 248, 193 and 157 nm, respectively. Lasers provide the advantage that they emit a beam, which has a single wavelength and is collimated to the required degree. Essential for the present imaging method is that the illumination beam is substantially a collimated beam. The best results are obtained with a fully collimated beam, i.e. a beam having an aperture angle of 0°. However satisfactory results can also be obtained with a beam having an aperture angle which is smaller than 1°.

The required movement, with respect to each other, of the resist layer, on the one hand, and the array of light valves and the array of microlenses, on the other hand, is most practically performed by movement of the substrate stage. Substrate stages currently used in wafer steppers are very suitable for this purpose, because they are more than accurate enough. It will be clear that movement of the substrate stage, for either the stepping mode or the scanning mode, should be synchronized with switching of the light valve. To that end, the computer 30 of FIG. 2, which controls the light valve array, may also control the movement of the stage.

An image pattern larger than the illumination field of one array of light valves and one array of refractive lenses can be produced by dividing, in the software, such a pattern into sub-patterns and successively transferring the sub-patterns to neighbouring resist areas having the size of the image field. By using an accurate substrate stage, the sub-image patterns can be put together precisely so that one non-interrupted large image is obtained.

A large image pattern can also be produced by using a composed light valve array and a composed refractive lens array. The composed light valve array comprises, for example, five LCDs, each having 1000×1000 light valves. The LCDs are arranged in a series to cover, for example, the width of the image pattern to be produced. The composed refractive lens array is constructed in a corresponding way to fit to the composed light valve array. The image pattern is produced by first scanning and illuminating a resist area having a length covered by a single array of light valves and a width covered by the series of light valve arrays. Subsequently, the substrate with the resist layer and the series of arrays are displaced relative to each other in the longitudinal direction over a distance covered by a single array. Then a second resist area, which now faces the composed arrays is scanned and illuminated, etc. until the whole image pattern has been produced.

An essential parameter for the imaging process is the gap width 44 (FIG. 2). Gap width is one of the input parameters for computing the required power of the refractive lenses and is determined by the required image resolution. If a refractive lens array is computed and manufactured for a given gap width and resolution, this resolution can only be obtained for the given gap width. If, in real circumstances, the gap width deviates from said given gap width, the required resolution cannot be achieved.

The minimum size of the spots is also related to the gap width. If the gap width is reduced, this size can be decreased, for example below 1 µm. A smaller gap width, and thus a smaller spot size, requires a better control of this width.

The present method is suitable for the manufacture of a device composed of sub-devices, which are positioned at different levels. Such a device may be a purely electronic device or a device that comprises two or more different kinds of features from a diversity of electrical, mechanical or optical systems. An example of such a system is a micro-optical-electrical-mechanical system, known as MOEMS. A more specific example is a device comprising a diode laser or a detector and a light guide and possibly lens means to couple light from the laser into the light guide or from the light guide into the detector. The lens means may be planar diffraction means. For the manufacture of a multilevel device, a substrate is used that has a resist layer deposited on different levels.

In principle, a multiple level device could be manufactured by means of an apparatus having a microlens array, which comprises collections of refractive lenses, which collections differ from each other in that the focal plane of the refractive lenses of each collection is different from that of the other collections. Such an apparatus allows simultaneous printing in different planes of the substrate.

A more practical, and thus preferred method of producing multiple-level devices is to divide software-wise the total image pattern into a number of sub-images each belonging to a different level of the device to be produced. In a first sub-imaging process, a first sub-image is produced, wherein the resist layer is positioned at a first level. The first sub-imaging process is performed according to the, scanning or stepping, method and by the means described hereinbefore. Then the resist layer is positioned at a second level, and in a second sub-imaging process, the sub-image belonging to the second level is produced. The shifting of the resist layer in the Z-direction and the sub-imaging processes are repeated until all sub-images of the multiple-level device are transferred to the resist layer.

The method of the invention can be carried out with a robust apparatus that is, moreover, quite simple as compared with a stepper or step-and-scan lithographic projection apparatus.

Figure 3:
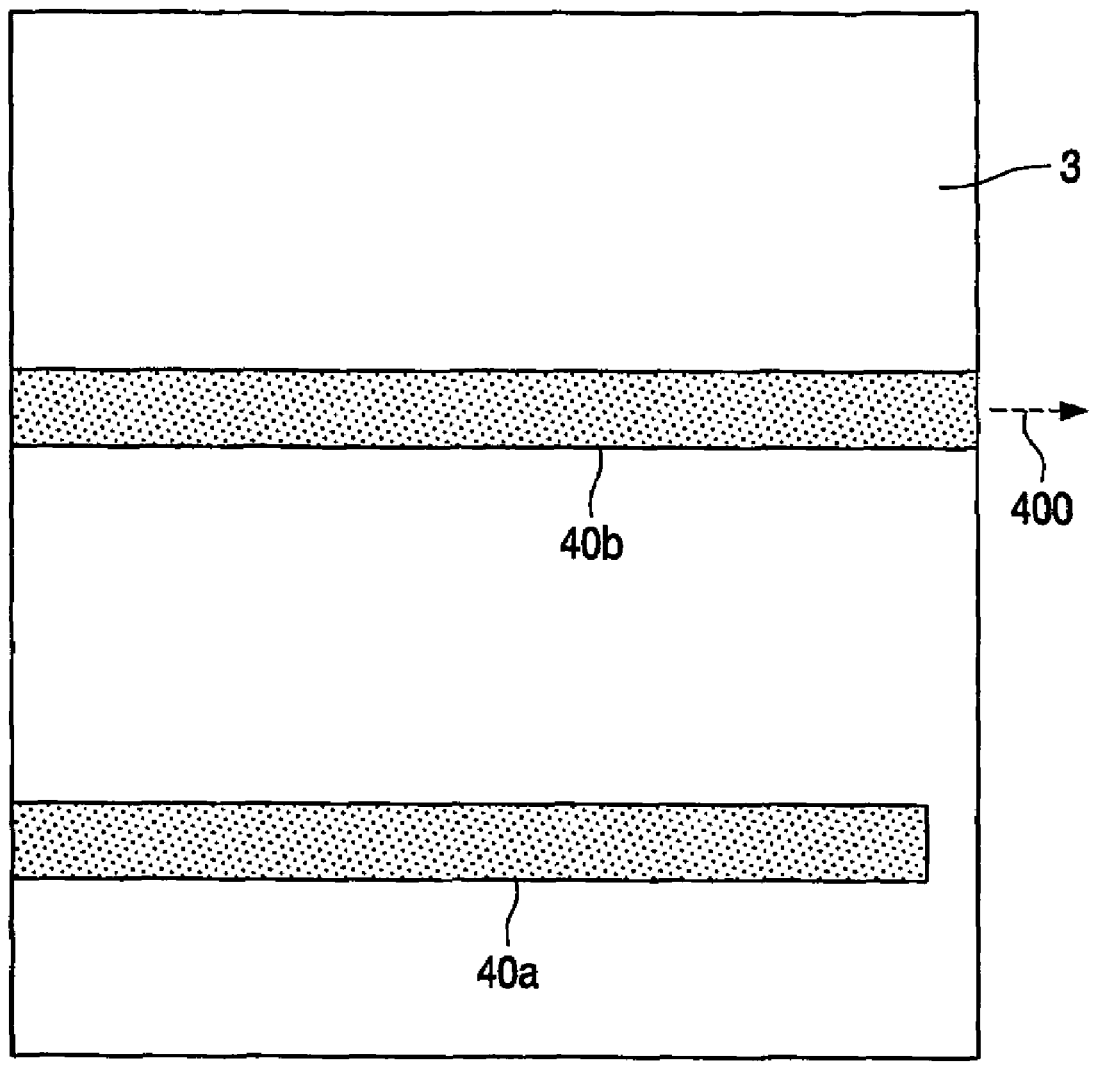
FIG. 3 illustrates schematically a lens array before and after application of a method according to an exemplary embodiment of the invention.

Referring to FIG. 3 of the drawings, the scale of the image written into the substrate 3 is periodically measured (substrate scale) and compared with the scale of the image required to be written (image scale). If a difference between the two scales is identified, then the distance between the lenses in the lens array 40 is adjusted by, for example, applying a force thereto or changing its temperature. In the illustrated example, reference number 40a denotes the lens array at its normal length. A force, for example in the direction of the arrow denoted 400, may be actively applied to one side of the lens array, whereby the other side is fixed (as illustrated in FIG. 3, 40b). Alternatively, an active force may be applied to both sides of the lens array, such that the position thereof can also be regulated. The level of discrepancy between the scales tends to be of the order of microns (maximum, say, 100 microns). The extent of adjustment can be continuously controlled by position (dimension) feedback and a controller. Some algorithms might be used to predict the force needed for a certain deformation.

The force can be applied by means of a number of different types of actuator, examples of which include Lorenz and Piezo. The amount of expansion resulting from the application of force can be determined by measuring the force and this, in combination with the stiffness of the lens array, can be used to give the amount of expansion. A control circuit (not shown) may be provided to calculate and apply the correct amount of expansion.

By changing the relative positions of the lenses in the lens array (in the X and/or Y direction), the resultant light beams from the micro-mirrors will no longer be collinear with the optical axes of the lenses in the array (bearing in mind that the position of the light beams remains fixed). By means of small movements of the micro-lenses, the spots, now slightly displaced, become focused on the substrate. This can be measured by means of a spot calibration and measurement system.

In the event of a large movement of the lenses in the lens array by a large force, the magnification of the optics which the micro-mirrors present to the lens array can, by means of a separate optical system (e.g. anamorphic lenses) be slightly adjusted (in the X and/or Y direction) such that the light beams once again fall collinearly onto the micro-lenses. In other words, optical aberrations, which may occur if larger distance changes are needed can be compensated by adaptation of the optical system that images the display on the lens array.

Thus the present invention provides a method and apparatus for fast adaptation of the image scale to the substrate scale, and is applicable to any flexible lithography (lithography with a changeable mask pattern) system, wherein the mask is formed by an array of light valves and a corresponding array of microlenses close to the substrate.

In practice, the method of the invention will be applied as one step in a process for manufacturing a device having device features in at least one process layer of a substrate. After the image has been printed in the resist layer on top of the process layer, material is removed from, or added to, areas of the process layer, which areas are delineated by the printed image. These process steps of imaging and removing or adding material are repeated for all process layers until the whole device is finished. In those cases where sub-devices are to be formed at different levels and use can be made of multiple level substrates, sub-image patterns associated with the sub-devices can be imaged with different distances between the imaging element and the resist layer.

The invention can be used for printing patterns of, and thus for the manufacture of display devices like LCD, Plasma Display Panels and PolyLed Displays, printing circuit boards (PCB) and micro multiple function systems (MOEMS).

The invention cannot only be used in a lithographic proximity printing apparatus but also in other kinds of image-forming apparatus, such as a printing apparatus or a copier apparatus.

Figure 4:
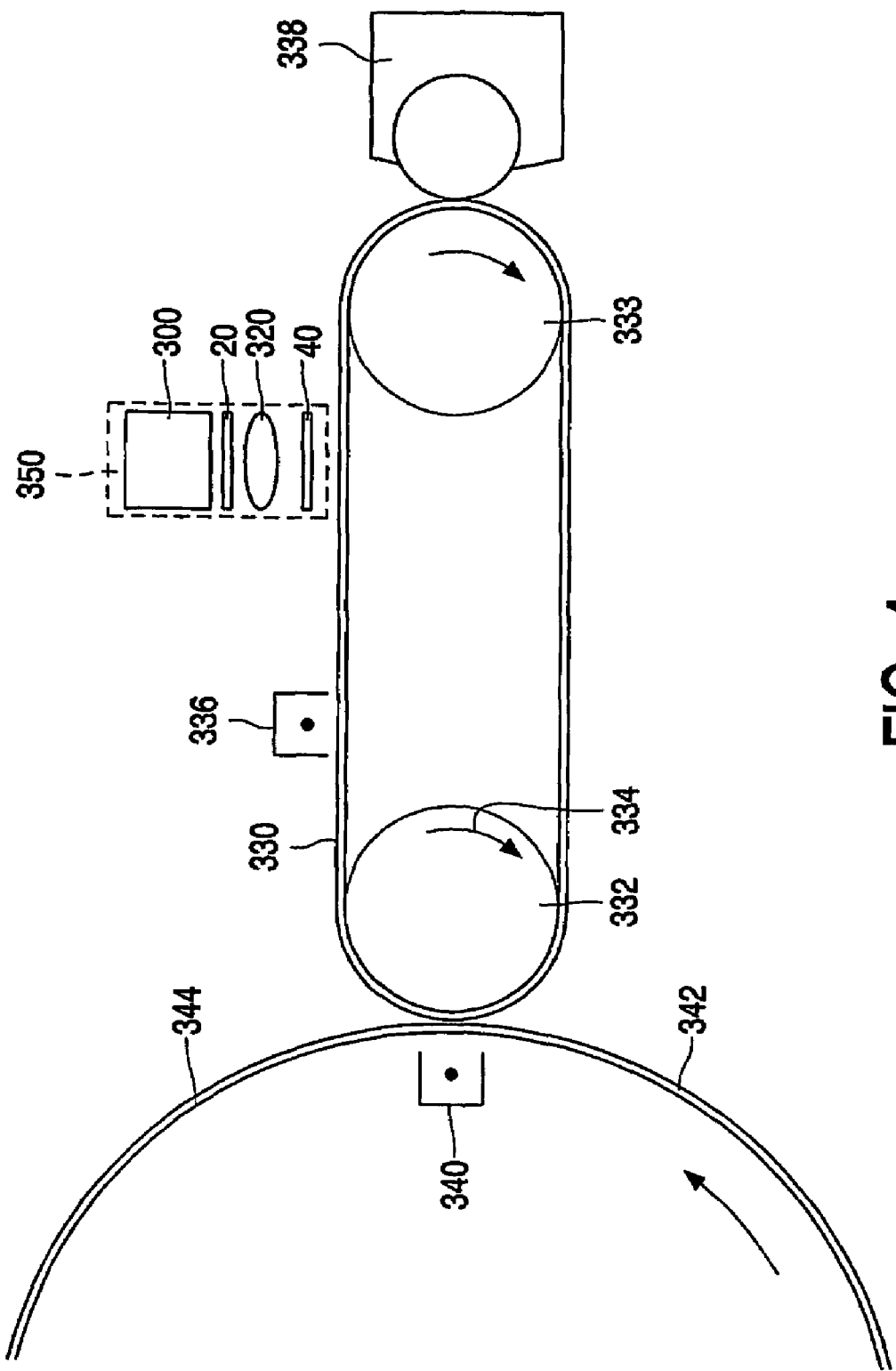
FIG. 4 is a schematic diagram illustrating an embodiment of printing apparatus wherein the invention can be used.

FIG. 4 shows an embodiment of a printer, which comprises an array of light valves and a corresponding array of refractive lenses according to the invention. The printer comprises a layer 330 of radiation-sensitive material, which serves as an image carrier. The layer 330 is transported by means of two drums, 332 and 333, which are rotated in the direction of arrow 334. Before arriving at the exposure unit 350, the radiation-sensitive material is uniformly charged by a charger 336. The exposure station 350 forms an electrostatic latent image in the material 330. The latent image is converted into a toner image in a developer 338 wherein supplied toner particles attach selectively to the material 330. In a transfer unit 340 the toner image in the material 330 is transferred to a transfer sheet 342, which is transported by a drum 344.

It should be noted that the above-mentioned embodiment illustrates rather than limits the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of forming an optical image in a radiation-sensitive layer, the method comprising the steps of:
   providing a radiation source (17);
   providing a radiation-sensitive layer (5);
   positioning a plurality of individually controlled light valves (21-25) between the radiation source (17) and the radiation-sensitive layer (5);
   positioning an optical element (40) comprising a plurality of radiation-converging elements (43) between said light valves (21-25) and the radiation-sensitive layer (5), such that each converging element (43) corresponds to a different one of the light valves (21-25) and serves to converge radiation from the corresponding light valve in a spot area in the radiation-sensitive layer (5);
   simultaneously writing image portions in radiation-sensitive layer areas by scanning said layer (5), on the one hand, and the associated light valve/converging element pairs, on the other hand, relative to each other and switching each light valve (21-25) between an on and an off state in dependence upon the image portion to be written by the light valve (21-25); the method being characterized by the steps of
   measuring said written image portions and comparing a scale thereof to a corresponding image scale of the image portions required to be written by the light valves (21-25) to determine whether or not there is a difference therebetween; and if so,
   adjusting said image scale so as to correspond with said measured scale;
   wherein said adjusting step comprises physically altering a distance between one or more adjacent radiation-converging elements (43) relative to each other.

2. A method according to claim 1, characterized in that the step of physically altering a distance between one or more adjacent radiation-converging elements (43) relative to each other comprises applying a force, either compressive or expansive, to said optical element (40) so as to respectively push the plurality of radiation-converging elements (43) towards each other or pull them apart.

3. A method according to claim 1, characterized in that the step of physically altering a distance between one or more adjacent radiation-converging elements (43) relative to each other comprises selectively increasing or decreasing the temperature of the optical element (40) so as to respectively expand the optical element (40) and increase the distance between the radiation-converging elements, or compress the optical element and decrease the distance between the radiation-converging elements (43).

4. A method according to claim 1, wherein the converging elements (43) are arranged to form a matrix array of spots.

5. A method according to claim 1, wherein the converging elements (43) comprise refractive lenses.

6. A method according to claim 1, characterized in that, between successive sub-illuminations, the radiation-sensitive layer (5) and the arrays are displaced relative to each other over a distance which is at most equal to the size of the spots formed in the radiation-sensitive layer (5).

7. A method according to claim 1, characterized in that the intensity of a spot at the border of an image feature in adapted to the distance between this feature border and a neighbouring feature.

8. A method according to claim 1, forming part of a lithographic process for producing a device in a substrate (3), characterized in that the radiation-sensitive layer (5) is a resist layer provided on the substrate (3), and in that image pattern corresponds to the pattern of features of the device to be produced.

9. A method according to claim 8, further characterized in that the image is divided into sub-images each belonging to a different level of the device to be produced, and in that, during formation of the different sub-images, the resist layer surface (5) is set at different distances from the radiation converging elements (43).

10. A method according to claim 1 forming part of a process for printing a sheet of paper, characterized in that the radiation-sensitive layer is a layer of electrostatically charged material.

11. A method according to claim 1, characterized in that the array of light valves (21-25) is positioned to directly face the converging elements (43).

12. A method according to claim 1, characterized in that the light valves (21-25) are imaged on the converging elements (43).

13. An apparatus for carrying out the method according to claim 1, the apparatus comprising:
   a radiation source (17);
   positioning means for positioning a radiation-sensitive layer (5) relative to the radiation source (17);
   a plurality of individually controllable light valves (21-25) arranged between the source (17) and the location for the radiation-sensitive layer (5); and
   an imaging element (40) comprising a plurality of radiation-converging elements (43) arranged between the light valves (21-25) and the location of the radiation-sensitive layer (5), such that each converging element (43) corresponds to a different one of the light valves (21-25) and serves to converge radiation from the corresponding light valve in a spot area in the radiation-sensitive layer (5);
   means for simultaneously writing image portions in radiation-sensitive layer areas by scanning said layer (5), on the one hand, and the associated light valve/converging element pairs, on the other hand, relative to each other and switching each light valve (21-25) between an on and an off state in dependence upon the image portion to be written by the light valve (21-25); the apparatus being characterized by:
   means for measuring said written image portions and comparing a scale thereof to a corresponding image scale of the image portions required to be written by the light valves to determine whether or not there is a difference therebetween and, if so, for adjusting said image scale so as to correspond with said measured scale by physically altering a distance between one or more adjacent radiation-converging elements (43) relative to each other.

14. A method of manufacturing a device in at least one process layer of a substrate, the method comprising the steps of:
   forming an image, comprising features corresponding to device features to be configured in the process layer, in a resist layer (5) provided on the process layer; and
   removing material from, or adding material to, areas of the process layer which areas are delineated by the image formed in the resist layer (5); the method being characterized in that the image is formed by means of a method according to claim 1.

\* \* \* \* \*